United States Patent [19]

Isono

[11] Patent Number: 5,463,255

[45] Date of Patent: Oct. 31, 1995

[54] SEMICONDUCTOR INTEGRATED CIRCUIT DEVICE HAVING AN ELECTRODE PAD INCLUDING AN EXTENDED WIRE BONDING PORTION

[75] Inventor: Toshio Isono, Tokyo, Japan

[73] Assignee: NEC Corporation, Japan

[21] Appl. No.: 35,638

[22] Filed: Mar. 23, 1993

[30] Foreign Application Priority Data

Mar. 30, 1992 [JP] Japan ................................. 4-103630

[51] Int. Cl.⁶ .................................................. H01L 23/50
[52] U.S. Cl. ........................... 257/773; 257/758; 257/779; 257/774; 257/784
[58] Field of Search ........................... 257/774, 784, 257/758, 759, 752, 780, 781, 779, 773

[56] References Cited

U.S. PATENT DOCUMENTS

| | | | |
|---|---|---|---|
| 4,185,294 | 1/1980 | Sumitomo et al. | 257/752 |
| 5,075,753 | 12/1991 | Kozono | 257/207 |
| 5,294,837 | 3/1994 | Takase et al. | 257/758 |

FOREIGN PATENT DOCUMENTS

| | | | |
|---|---|---|---|
| 60-227444 | 11/1985 | Japan | 257/774 |
| 61-187262 | 8/1986 | Japan | 257/781 |
| 61-234052 | 10/1986 | Japan | 257/774 |
| 61-225837 | 10/1986 | Japan | 257/774 |
| 61-292947 | 12/1986 | Japan | 257/781 |
| 2-123753 | 5/1990 | Japan | 257/758 |
| 8624497 | 4/1987 | United Kingdom | 257/774 |

*Primary Examiner*—Sara W. Crane
*Assistant Examiner*—John Guay
*Attorney, Agent, or Firm*—Laff, Whitesel, Conte & Saret, Ltd.

[57] ABSTRACT

Disclosed is a semiconductor integrated circuit device with an electrode pad having a lower conductive film (second aluminum film) formed on a semiconductor substrate, an upper conductive film (third aluminum film) formed through an interlayer insulating film (second interlayer insulating film) on the lower conductive film. The upper conductive film is electrically connected to the lower conductive film by a minute through hole, and extends to a planar region where the lower conductive film is not present. That extending portion of the upper conductive film serves as a wire bonding portion. This design allows the through hole to be formed as small as the inner through hole of the integrated circuit, so that this electrode pad will have an improved bonding characteristic while being able to cope with a through-hole filling step.

14 Claims, 3 Drawing Sheets

SEMICONDUCTOR INTEGRATED CIRCUIT DEVICE HAVING AN ELECTRODE PAD INCLUDING AN EXTENDED WIRE BONDING PORTION

BACKGROUND OF THE INVENTION

1. Field of the Invention

The present invention relates to a semiconductor integrated circuit device, and, more particularly, to a semiconductor integrated circuit device fabricated by using a wire bonding technology.

2. Description of the Related Art

Wire bonding is one way of connecting a semiconductor chip to an external substrate or to an external package. This bonding is used to connect an electrode pad provided in a semiconductor chip and an external substrate or the electrode portion of an external package, the connections are made with gold wires about 30 μm in diameter. Today, wire bonding is typical used in assembling semiconductor integrated circuit devices because it is comparatively easy to accomplish and has a high reliability.

Gold wires are bonded to an electrode pad as follows in wire bonding. First, a so-called capillary is positioned above the target electrode pad with a ball about 80 to 100 μm in diameter formed at the end of the gold wire that is to be fed out from the capillary. Then, the capillary descends, bringing the ball into contact with the electrode pad. Ultrasonic vibration is then applied to increase the bonding strength between the gold ball and the electrode pad. The electrode pad should, therefore, be designed with a sufficient mechanical strength and flatness at the bonding surface.

FIG. 1 illustrates the structure of a conventional electrode pad; FIG. 1(a) shows the layout, and FIG. 1(b) being its cross section. Referring to FIG. 1, the electrode pad has a semiconductor substrate 30, a first aluminum film 31, an interlayer insulating film 32, a second aluminum film 33, and a square through hole 32a formed in the interlayer insulating film 32 to enable a connection between the first and second aluminum films 31 and 33. Each side of the through hole 32a is set to be about 90 to 110 μm, larger than the diameter of the gold ball in order, to enhance the strength of the second aluminum film 33 that is to be bonded with the gold ball as well as to ensure the needed flatness of the bonding surface. If each side of the through hole 32a becomes smaller than the diameter of the gold ball, the interlayer insulating film 32 will come under the bonding surface and the bonding pressure applied thereafter might crack the interlayer insulating film 32. The crack would hinder the propagation of ultrasonic vibration and impair the flatness, thus lowering the bonding strength between the gold ball and the electrode pad.

As the sizes involved in the recent semiconductor fabrication has entered into the order of submicrons and as multi-layering is accelerated, some changes on the metallizing process to form an electrode pad are proposed. More specifically, it becomes difficult to stably fill the through holes, formed in the order of submicrons, with the conventional aluminum sputtering alone, so that a through-hole filling step is newly provided prior to the aluminum sputtering step. The through-hole filling step would not be effective unless the through holes have uniform heights and depths. Accomplishing the uniform heights and depths of the through holes requires that the through holes have the same diameter, the aluminum areas directly below the through holes have the same structure, and the layout patterns around the holes are the same.

The diameter of the through hole 32a in the conventional electrode pad in FIG. 1 differs by two figures from that of the through holes used for wiring devices within a chip. Further, the layout pattern around the internal through holes located in the inner area where aluminum wires which are 1 to 2 μm wide run in all directions which clearly differs from that around the through hole 32a in FIG. 1.

If the conventional electrode pad of FIG. 1 is formed in a fabrication process that includes the through-hole filling step, there may be an improper filling of the through hole 32a, raising a problem on the flatness of the electrode pad or the bonding characteristic. If the through hole of the electrode pad is made smaller, as an alternative, it is difficult to obtain an electrode pad with the desired size.

SUMMARY OF THE INVENTION

It is therefore an object of the present invention to provide a semiconductor integrated circuit device with an electrode pad, which can cope with the through-hole filling step and which has an excellent bonding characteristic.

To achieve this object, a semiconductor integrated circuit device according to the present invention has an electrode pad including a lower conductive film formed on a semiconductor substrate, an upper conductive film formed through an interlayer insulating film on the lower conductive film, the upper conductive film being electrically connected to the lower conductive film by a minute through hole, the upper conductive film extending to a planar region where the lower conductive film is not present, that extending portion of the upper conductive film serving as a wire bonding portion.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1A:
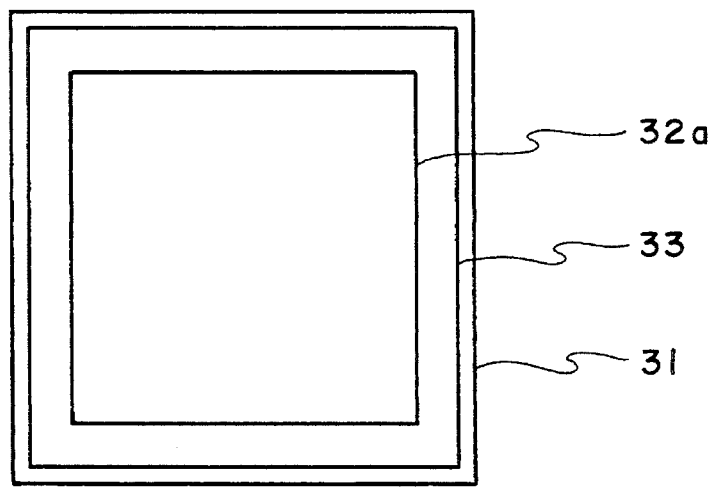
FIG. 1 is a diagram illustrating a conventional electrode pad, FIG. 1(a) showing the layout and FIG. 1(b) being a cross-sectional view.
Figure 1B:
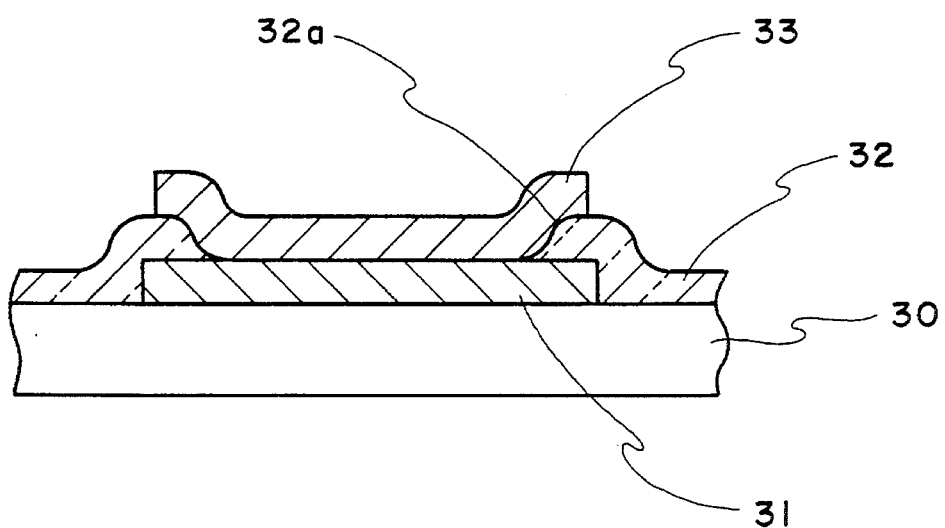
Figure 2A:
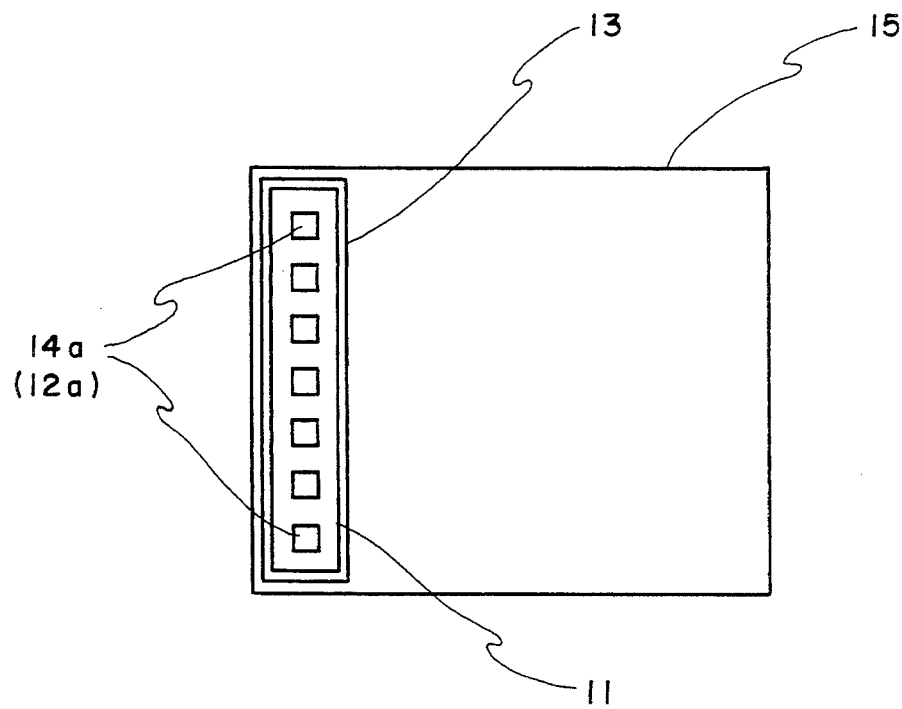
FIG. 2 is a diagram illustrating a first embodiment, FIG. 2(a) showing the layout and FIG. 2(b) being a cross-sectional view.
Figure 2B:
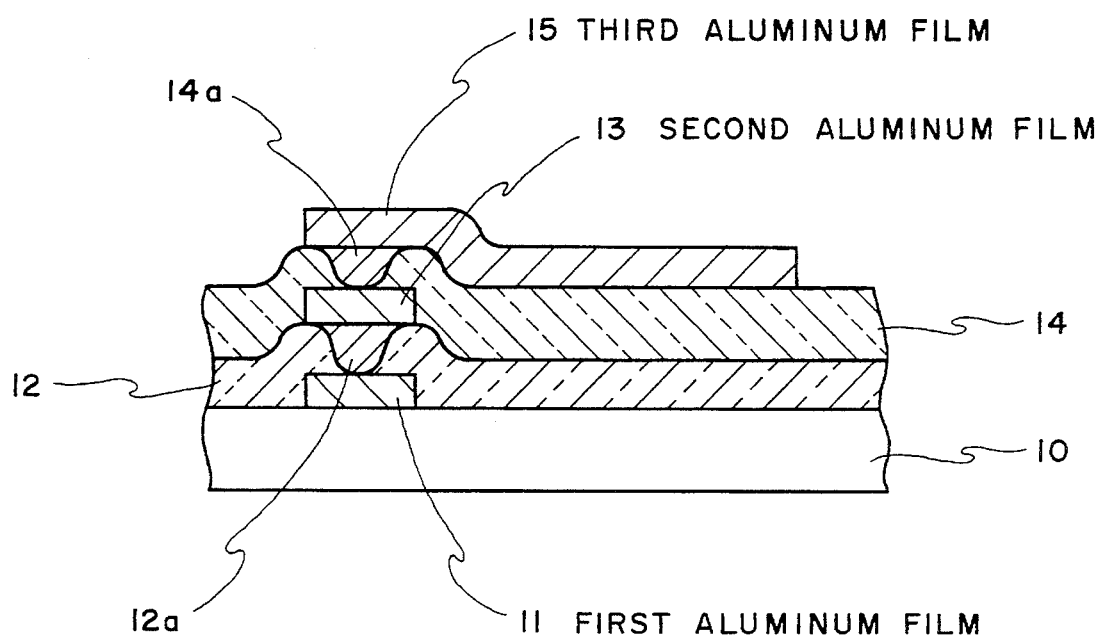

The present invention will now be described referring to the accompanying drawings. FIG. 2 illustrates a first embodiment of the present invention, FIG. 2(a) showing the layout and FIG. 2(b) being a cross-sectional view. Reference numeral 10 denotes a semiconductor substrate. Formed on the semiconductor substrate 10 is a first aluminum film 11 with the normal wiring width. This aluminum film 11 is covered with an interlayer insulating film 12, which has minute through holes 12a formed therein. A second aluminum film 13 is deposited over the through holes 12a of the interlayer insulating film 12, with the same wiring width as the first aluminum film 11, so that the second aluminum film 13 is connected via the through holes 12a to the first aluminum film 11. The second aluminum film 13 is also covered with an interlayer insulating film 14. After minute through holes 14a are formed in the interlayer insulating film 14, a third aluminum film 15 is deposited on the interlayer insulating film 14 to serve as an electrode pad. This third aluminum film 15 extends to that area where no through holes 14a are present, yielding an electrode pad of the desired size. The electrode pad is therefore connected only at one side portion to the second aluminum film 13, the connection being via the through holes 14a.

The diameter of each of the through holes 12a and 14a is set smaller than that of the through hole of the conventional electrode pad, but is the same as that of each through hole used to connect wiring layers (not shown). To reduce the bonding resistance between the individual aluminum films, a plurality of through holes are provided in this embodiment.

With the above-described structure of the electrode pad, the diameter of each through hole 12a, 14a equals that of the other through holes. Thus, this structure can cope with the through-hole filling step and can overcome the conventional problem centered on defective or improper hole filling. The bonding portion of the electrode pad has two interlayer insulating films 12 and 14 under the aluminum film 15, as reinforcement against the gold ball-bonding pressure, making it harder to crack.

Figure 3A:
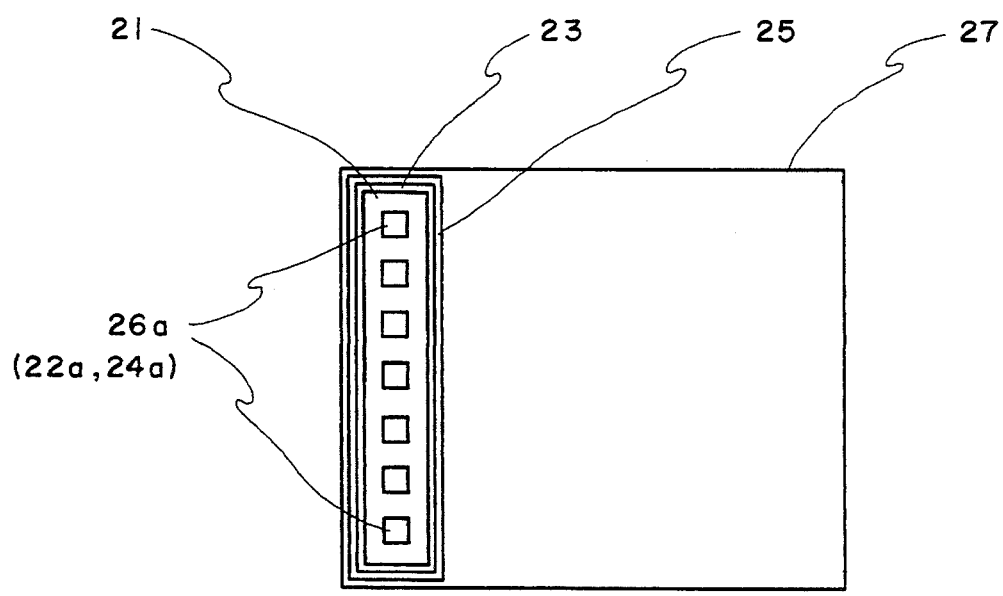
FIG. 3 is a diagram illustrating a second embodiment, FIG. 3(a) showing the layout and FIG. 3(b) being a cross-sectional view.
Figure 3B:
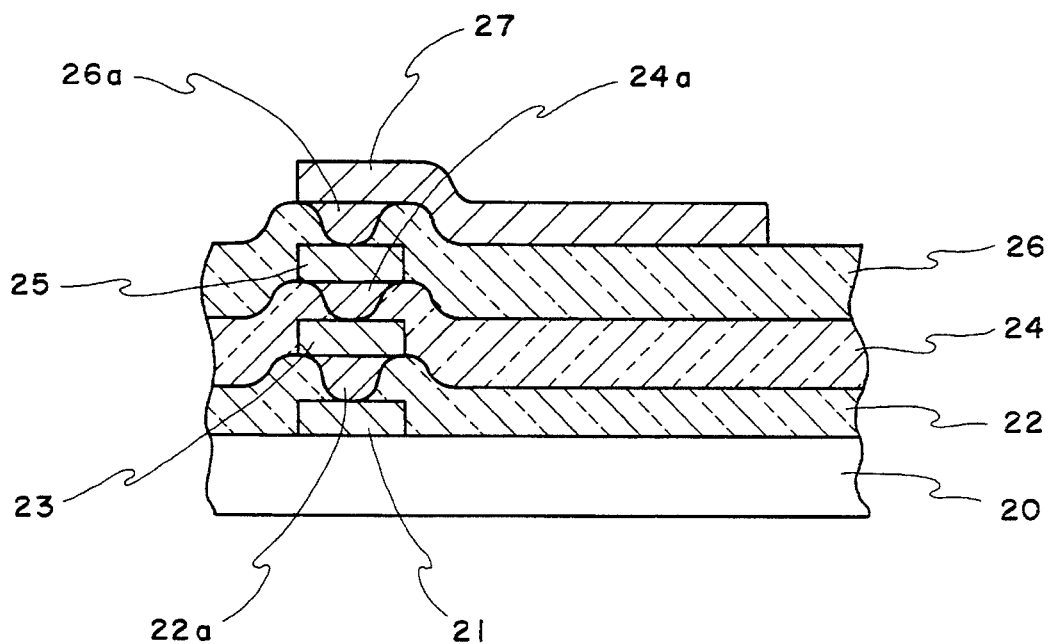

FIG. 3 illustrates a second embodiment of the present invention, FIG. 3(a) showing the layout and FIG. 3(b) being a cross-sectional view. In this embodiment, first to third aluminum films 21, 23 and 25 are formed on a semiconductor substrate 20, are respectively covered with first to third interlayer insulating films 22, 24 and 26, and are connected to one another by minute through holes 22a and 24a. After minute through holes 26a are formed in the third interlayer insulating film 26, a fourth aluminum film 27 is formed as an electrode pad and is electrically connected to the third aluminum film 25 via through holes 26a.

With this structure, the first to fourth aluminum films 21, 23, 25 and 27 are connected to one another via the minute through holes 22a, 24a and 26a only at one side portion of the electrode pad that is formed by the fourth aluminum film 27. This design can allow the through holes to be made smaller, thus preventing an improper filling of the through holes from occurring in the through-hole filling step. Further, the presence of the three interlayer insulating films 22, 24 and 26 under the bonding portion of the electrode pad can prevent the bonding portion from cracking at the time of gold ball bonding.

Though not illustrated, a plurality of through holes may be formed on any or all of the remaining three sides of the electrode pad to reduce the bonding resistance at the through holes.

In short, according to the present invention, parts of the upper conductive film are electrically connected to the lower conductive film via the minute through holes. The area of the upper conductive film where the through holes are not present serves as the bonding portion. This design can eliminate the need for through holes with a large diameter for forming the electrode pad and can prevent an improper filling of the through holes in the fabrication of a semiconductor integrated circuit device which involves a through-hole filling step. It is, therefore, possible to provide an electrode pad having an excellent flatness and good bonding characteristic.

Therefore, the present examples and embodiments are to be considered as illustrative and not restrictive and the invention is not to be limited to the details given herein, but may be modified within the scope of the appended claims.

What is claimed is:

1. A semiconductor integrated circuit device having an electrode pad including:

a semiconductor substrate having a major surface;

a lower conductive film being formed on a limited area of said major surface of said semiconductor substrate, said limited area leaving at least one planar region on said major surface where said lower conductive film does not exist;

an interlayer insulating film formed over at least said lower conductive film and at least said planar region;

an upper conductive film being formed over said lower conductive film and at least said planar region with said interlayer insulating film being interposed between said upper and lower conductive films, a plurality of minute through holes extending from said upper conductive film through said interposed insulating film to said lower conductive film, said upper conductive film being electrically connected to said lower conductive film via said plurality of minute through holes, said portion of said upper conductive film extending over said planar region providing means for bonding a wire to said upper conductive film, and said portion of said interposed interlayer insulating film extending over said planar region providing means for uniformly supporting said wire bonded to said upper conductive film wherein said upper conductive film has a width which is the same as a width of said lower conductive film within a region of said limited area where said upper conductive film overlies said lower conductive film.

2. The semiconductor integrated circuit device according to claim 1, wherein said lower conductive film and said upper conductive film are made of aluminum.

3. A semiconductor integrated circuit device having an electrode pad formed on a surface of a semiconductor substrate, said pad including a lower conductive film layer portion and an upper conductive film layer portion separated by an interlayer insulating film, said lower conductive film portion extending over a limited area on said surface of said substrate, a planar region on said surface of said substrate adjacent said limited area, said planar region being free of said lower conductive film, said upper conductive film portion extending over at least said limited area of said lower conductive film portion, said upper conductive film being electrically connected to said conductive film portion of said lower layer portion via a plurality of minute through holes formed through said interlayer insulating film, said minute through holes being formed along at least one edge side portion of said electrode pad, said upper conductive film and said interposed interlayer insulating film further extending to said planar region which is free of said lower conductive film portion, said extending portion of said upper conductive film providing means for bonding a wire to said upper conductive film and said extending portion of said interposed interlayer insulating film providing means for uniformly supporting said wire bonded portion of said upper conductive film wherein said upper conductive film has a width which is the same as a width of said conductive film portion of said lower layer portion.

4. The semiconductor integrated circuit device according to claim 3, wherein said conductive portion of said lower layer portion and said upper conductive film are made of aluminum.

5. The semiconductor integrated circuit device according to claim 3, wherein said minute through holes are formed in two sides of said interlayer insulating film.

6. The semiconductor integrated circuit device according to claim 3, wherein said minute through holes are formed in three sides of said interlayer insulating film.

7. The semiconductor integrated circuit device according to claim 3, wherein said minute through holes are formed in four sides of said interlayer insulating film.

8. The semiconductor integrated circuit device according to claim 3, wherein said minute through holes have a square shape.

9. A semiconductor integrated circuit device having a semiconductor substrate with a major surface, an electrode pad on said substrate, said pad including a lower layer portion and an upper layer portion, said upper layer portion having:

a lower conductive film layer on a limited area of said major surface;

said limited area leaving a planar region on said major surface where said lower conductive film layer does not exist, a first upper conductive film being formed over said conductive film portion of said lower conductive film layer portion, a first interlayer insulating film interposed between said upper and lower conductive films, a first plurality of minute through holes in said first insulating film, said first upper conductive film being electrically connected to said lower conductive film portion via said first plurality of minute through holes, said first plurality of minute through holes being formed in said first interlayer insulating film along at least one side portion of said electrode pad, and a second upper conductive film being formed on said first upper conductive film, an interposed second interlayer insulating film being formed between said first and second upper conductive films, a second plurality of through holes being formed in said second interlayer insulating film along at least one side portion of said electrode pad, said second upper conductive film being electrically connected to said first conductive film via said second plurality of minute through holes formed through said interposed second interlayer insulating film, said second upper conductive film and said interposed first and second interlayer insulating films extending beyond said limited area and onto said planar region where said conductive film portion of said lower layer portion does not exist, said extending portion of said second upper conductive film providing means for bonding a wire, and said extending portions of said interposed first and second interlayer insulating films providing means for uniformly supporting said wire bonding portion of said second upper conductive film wherein said first and second upper conductive films have a width which is the same as a width of said conductive film portion of said lower layer portion.

10. The semiconductor integrated circuit device according to claim 9, wherein said conductive portion of said lower layer portion, and said first and second upper conductive films are made of aluminum.

11. The semiconductor integrated circuit device according to claim 9, wherein said first and second minute through holes are formed in two sides of said first and second interlayer insulating films, respectively.

12. The semiconductor integrated circuit device according to claim 9, wherein said first and second minute through holes are formed in three sides of said first and second interlayer insulating films, respectively.

13. The semiconductor integrated circuit device according to claim 9, wherein said first and second minute through holes are formed in four sides of said first and second interlayer insulating films, respectively.

14. The semiconductor integrated circuit device according to claim 9, wherein said first and second minute through holes have a square shape.

\* \* \* \* \*